United States Patent [19]

Suzuki

[11] Patent Number: 5,043,824

[45] Date of Patent: Aug. 27, 1991

[54] COLOR MASK RECORDING APPARATUS WITH LIGHT COMPONENTS SCANNED AT SET EXPOSURE AMOUNT CONVERSION RATES

[75] Inventor: Makoto Suzuki, Nagoya, Japan

[73] Assignee: Brother Kogyo Kabushiki Kaisha, Japan

[21] Appl. No.: 598,899

[22] Filed: Oct. 16, 1990

[30] Foreign Application Priority Data

Oct. 27, 1989 [JP] Japan ................................. 1-280945

[51] Int. Cl.[5] .......................... G03F 3/06; H04N 1/29; G01D 15/14
[52] U.S. Cl. .................................... 358/302; 358/300; 358/75; 346/107 R; 346/160; 355/35; 355/84; 355/88
[58] Field of Search ..................... 358/300, 302, 75-80; 346/107 R, 108, 110 R, 153.1, 160, 157; 355/202, 326, 327, 32, 35, 37, 38, 40, 83, 84, 88, 69, 80-81

[56] References Cited

U.S. PATENT DOCUMENTS

| | | |
|---|---|---|
| 3,700,329 | 10/1972 | Mason .................................... 355/81 |
| 4,814,597 | 3/1989 | Kruger .................................... 355/80 |
| 4,884,082 | 11/1989 | Sonoda et al. . | |
| 4,949,185 | 8/1990 | Nakai .................................... 358/300 |

Primary Examiner—Benjamin R. Fuller
Assistant Examiner—Scott A. Rogers
Attorney, Agent, or Firm—Oliff & Berridge

[57] ABSTRACT

A color image recording apparatus exposes a photosensitive recording medium to light through a succession of mask members produced by a monochromatic laser printer based on colored image information. An exposure unit exposes the photosensitive recording medium and includes a scanning unit driven at a predetermined scanning speed to expose the photosensitive recording medium to light through each of the mask members. An exposure amount setting unit selectively sets light exposures to be applied to the photosensitive recording medium by the scanning unit, and an exposure amount indicating unit selectively indicates exposure amounts to be applied to the photosensitive recording medium by the scanning unit. A data converting unit converts the exposure amount into equivalent scanning speed data to control the scanning speed of the exposure unit.

20 Claims, 5 Drawing Sheets

| RED | |
|---|---|
| LEVEL | SPEED |
| 1 | VR1 |
| 2 | VR2 |
| 3 | VR3 |
| 4 | VR4 |
| 5 | VR5 |
| 6 | VR6 |
| 7 | VR7 |
| 8 | VR8 |
| 9 | VR9 |
| 10 | VR10 |

| GREEN | |
|---|---|
| LEVEL | SPEED |
| 1 | VG1 |
| 2 | VG2 |
| 3 | VG3 |
| 4 | VG4 |
| 5 | VG5 |
| 6 | VG6 |
| 7 | VG7 |
| 8 | VG8 |
| 9 | VR9 |
| 10 | VG10 |

| BLUE | |
|---|---|
| LEVEL | SPEED |
| 1 | VB1 |
| 2 | VB2 |
| 3 | VB3 |
| 4 | VB4 |
| 5 | VB5 |
| 6 | VB6 |
| 7 | VB7 |
| 8 | VB8 |
| 9 | VB9 |
| 10 | VB10 |

FIG. 6

COLOR MASK RECORDING APPARATUS WITH LIGHT COMPONENTS SCANNED AT SET EXPOSURE AMOUNT CONVERSION RATES

BACKGROUND OF THE INVENTION

1. Field of the Invention

The present invention relates to a color image recording apparatus for recording a colored image on a photosensitive recording medium.

2. Description of the Related Art

One conventional method for recording a colored image on a color photosensitive recording medium (hereinafter also referred to as "photosensitive sheet") employs color separation filters of red (R), green (G) and blue (B) for producing color-separated mask members from an original color image. The photosensitive sheet is exposed to light successively through these mask members. There is also known a process for applying white light directly to a colored original image and exposing a photosensitive sheet to light reflected by the colored original image. The former colored image recording method is more efficient than the latter process in that the intensity of exposure energy required to be applied to the photosensitive recording medium by the former method is much smaller than that required by the latter process.

One inhouse proposal has been made with respect to a color image recording apparatus for electrophotographically producing mask members using toner as a light-shielding substance on a light transmissive sheet, and exposing a photosensitive sheet to light through such mask members for reproducing a colored image on the photosensitive sheet.

Further, a subsequent inhouse proposal has been made (as described in U.S. Pat. No. 4,884,082) regarding a color image recording apparatus for producing mask members using a commercially available monochromatic printer such as a laser beam printer, and reproducing a colored image in the same manner as disclosed in the above proposal. In the recording apparatus disclosed in U.S. Pat. No. 4,884,082, the mask members of red (R), green (G) and blue (B) are printed on ordinary paper sheets of cut form by the monochromatic printer, and monochromatic lights of red (R), green (G) and blue (B) are applied successively to a photosensitive recording medium through the mask members. Since the mask members are produced on ordinary plane papers, maintenance and handling of the mask members are facilitated, and the mask members are convenient to use especially when a number of colored images are to be produced using the same mask members or a colored image is to be reproduced at a later time using the mask members.

There has been also another inhouse proposal regarding an image recording apparatus in which mask members produced on respective cut sheets have respective identification marks indicating the colors of the mask members. This apparatus has a sensor for reading the identification marks on the mask members that have been delivered to an exposure position, so that the colors of lights to be applied through the mask members to a photosensitive sheet can automatically be selected so as to correspond to the mask members in use. This apparatus allows the photosensitive sheet to be exposed to light of desired colors irrespective of the sequence in which the mask members may be delivered to the exposure position. Therefore, the mask members may be manufactured in any desired order by a monochromatic printer, and the manufactured mask members may be inserted in any desired order into the color image recording apparatus, since a colored light corresponding to the applied mask member is irradiatable.

Further, in U.S. Pat. No. 4,884,082 which discloses the color image recording apparatus using the mask members, a mask member circulating passage is provided for repeatedly feeding the mask members to the exposure position end for positioning them when a number of colored images are to be reproduced from one set of such mask members. With the mask member circulating passage, it is not necessary to prepare mask members again on a monochromatic printer or to insert the mask members manually into a mask member feeder each time a colored image is to be reproduced. Consequently, color images can be recorded at a high speed.

The color image recording apparatus according to the subsequent inhouse proposal has three fluorescent lamps for emitting light having wavelengths corresponding to red (R), green (G) and blue (B). However, these three fluorescent lamps and their respective starter circuits have an overall size that requires a large space, and make the color image recording apparatus expensive to manufacture.

To avoid this drawback, there has been known a process for using a light source for emitting white color light, producing light of red, green and blue color from the white color light using color separation filters of the corresponding colors, and exposing a photosensitive sheet to the color-separated lights.

This image recording apparatus is of a slit-scanning exposure system, in which a photosensitive sheet is exposed through red, green and blue filters to light emitted through a slit by a lamp, and light exposure is regulated by regulating the scanning speed of the lamp. In setting the image recording apparatus for red, green and blue light exposures, desired red, green and blue light exposures are converted respectively into scanning speed data equivalent respectively to the desired red, green and blue light exposures by using a conversion table, and then the scanning speed data determined from the conversion table is entered manually by operating switches provided on the operating panel of the image recording apparatus.

Thus, the image recording apparatus requires a manual data input operation including operating the switches of the operating panel for converting the desired red, green and blue light exposures into the equivalent scanning speed data and for entering the scanning speed data. Therefore, the manual data input operation must be executed every time the red, green and blue light exposures need to be changed to deal with the change of the photosensitive recording medium for a photosensitive recording medium of different characteristics, the change of the photosensitive recording medium for another photosensitive recording medium of a different sensitivity or the desired change of the tone of the recorded image. Such frequent manual data input operation for setting red, green and blue light exposures is troublesome and very inconvenient.

SUMMARY OF THE INVENTION

In view of the aforesaid shortcomings of the inhouse image recording apparatus, it is an object of the present invention to provide a color image recording apparatus which is capable of automatically converting input red, green and blue light exposures entered by operating switches provided on an operating panel into equivalent scanning speeds to facilitate the light exposure and scanning speed setting procedure.

According to the present invention, these and other objects can be attained by providing a color image recording apparatus for recording an image on a photosensitive recording medium by means of light transmitted through a succession of mask members prepared based on colored image information. The color image recording apparatus comprises an exposure means for exposing the photosensitive recording medium including variable speed scanning means for exposing the photosensitive recording medium to light through each of the mask members at a predetermined scanning speed, an exposure amount setting means for selectively setting light exposures to be applied to the photosensitive recording medium by the scanning means, an exposure amount indicating means for selectively indicating an exposure amount to be applied to the photosensitive recording medium by the scanning means, and data converting means for converting the exposure amount into equivalent scanning speed data to drive the variable speed scanning means at the scanning speed equivalent to the exposure amount.

With the above arrangement, desired light exposures to be applied to the photosensitive recording medium are set by means of the light exposure setting means. In setting the desired light exposures, current light exposures entered by means of the light exposure setting means are displayed on the light exposure indicating means for reference. Data representing the desired light exposures set by means of the light exposure setting means is converted by the data converting means into equivalent scanning speed data for controlling the exposure means for scanning exposure operation, and then the exposure means operates according to the scanning speed data to apply the desired light exposures to the photosensitive recording medium for exposure. Thus, the light exposure data is converted automatically into the scanning speed data without requiring any manual data input and data converting operation to facilitate light exposure setting.

BRIEF DESCRIPTION OF THE DRAWINGS

The above and other objects, features and advantages of the present invention will become more apparent from the following description when taken in conjunction with the accompanying drawings in which a preferred embodiment of the present invention is shown by way of illustrative example, and wherein:

FIG. 6 is a view showing a conversion table to be stored in a memory included in the controller of the color image recording apparatus.

DETAILED DESCRIPTION OF THE PREFERRED EMBODIMENTS

Figure 1:
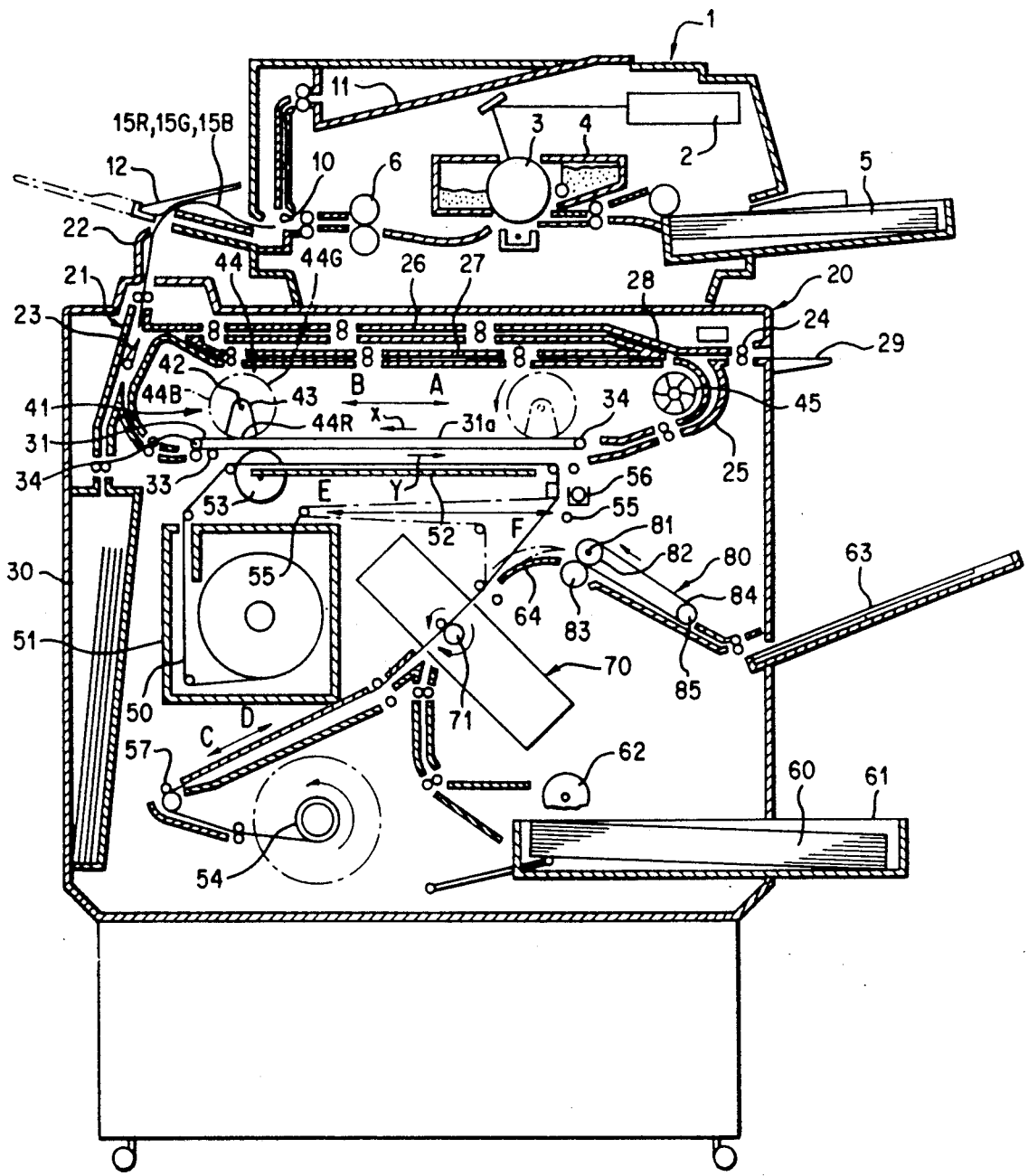
FIG. 1 is a schematic vertical cross-sectional view showing a color image recording apparatus according to the present invention.

FIG. 1 shows a color image recording apparatus 20 according to the present invention which is coupled to a monochromatic laser printer 1.

The laser printer 1 is placed on the top of the color image recording apparatus 20. The laser printer 1 has a polygon scanner 2 which applies a laser beam to an electrically charged photosensitive member such as a drum 3 to form an electrostatic latent image thereon. The electrostatic latent image on the photosensitive member 3 is then developed into a visible toner image by a developing unit 4. The toner image is thereafter transferred from the photosensitive drum 3 onto a sheet of a plane paper or an OHP sheet supplied from a sheet cassette 5, and then fixed by a fixing unit 6. The monochromatic laser printer 1 records data transmitted from a host computer (not shown) on sheets.

If a black-and-white image (monochromatic output image) is to be reproduced, then the printed sheet from the laser printer 1 is discharged by a sheet path selector 10 onto a discharge tray 11 or 12. If a colored image is to be reproduced, then the printed sheet from the laser printer 1 is first discharged onto the discharge tray 12, and then fed into the color image recording apparatus 20.

The distal end of the discharge tray 12 is angularly movable between a solid line position and a chain line position as shown in FIG. 1. When it is in the solid-line position, the printed sheet from the laser printer 1 is guided into the color image recording apparatus 20. A set of three monochromatically printed sheets from the laser printer 1 is used as a set of mask members 15R, 15G, 15B (also referred to collectively as a mask member or members 15) in the color image recording apparatus 20.

The construction of the color image recording apparatus 20 will be described below.

The color image recording apparatus 20 has a mask member feeder 21 disposed in an upper portion in an apparatus housing. The mask member feeder 21 includes a positioning unit 31, a circulation guide 25, and two parallel upper and lower storage trays 26, 27, which are coupled in a circulatory pattern. The junction between the positioning unit 31 and the storage trays 26, 27 is connected to the discharge tray 12 of the monochromatic laser printer 1 through a guide member 22, so that a printed sheet (mask member) from the monochromatic laser printer 1 is introduced into the mask member feeder 21.

The mask member feeder 21 includes a swingable gate 23 for selectively directing a mask member 15, which has been guided by the guide member 22, toward the positioning unit 31 or a discharge tray 30. Further, a swingable gate 28 is disposed between the circulation guide 25 and the storage trays 26, 27. The gate 28 directs a mask member 15, which has been guided by the circulation guide 25, into the upper storage tray 26 or the lower storage tray 27. A mask member 15 which has been inserted from a manual feed tray 29 can be introduced into the mask member feeder 21 through a gate 24.

The feed belt 31a of the positioning unit 31 is in the form of an endless belt made of a light-transmissive dielectric material such as polyethylene terephthalate (PET). The feed belt 31a is trained around two spaced shaft 34. At least one of the shafts 34 is rotatable about its own axis by a motor (not shown) for circulating the belt 31a in the direction indicated by an arrow in FIG. 1. The surface of the feed belt 31a is electrically charged by an electric charger such as a corotron (not shown) for electrostatically attracting the mask member 15. A sensor bar 33 supporting positioning mark sensors 33a (FIG. 3) and mask member identifying mark sensors 33b (FIG. 3) is positioned near one end of the feed belt 31a. The positioning mark sensors serve to read positioning marks printed on predetermined portion of a mask member 15 for locating the mask member 15 in a given position, and the mask member identifying mark sensors serve to identify the color of the mask member 15.

An exposure device 41 is disposed above the positioning unit 31. The exposure device 41 is movable horizontally along the positioning unit 31 in the direction of arrows A, B in FIG. 1.

Figure 4A:
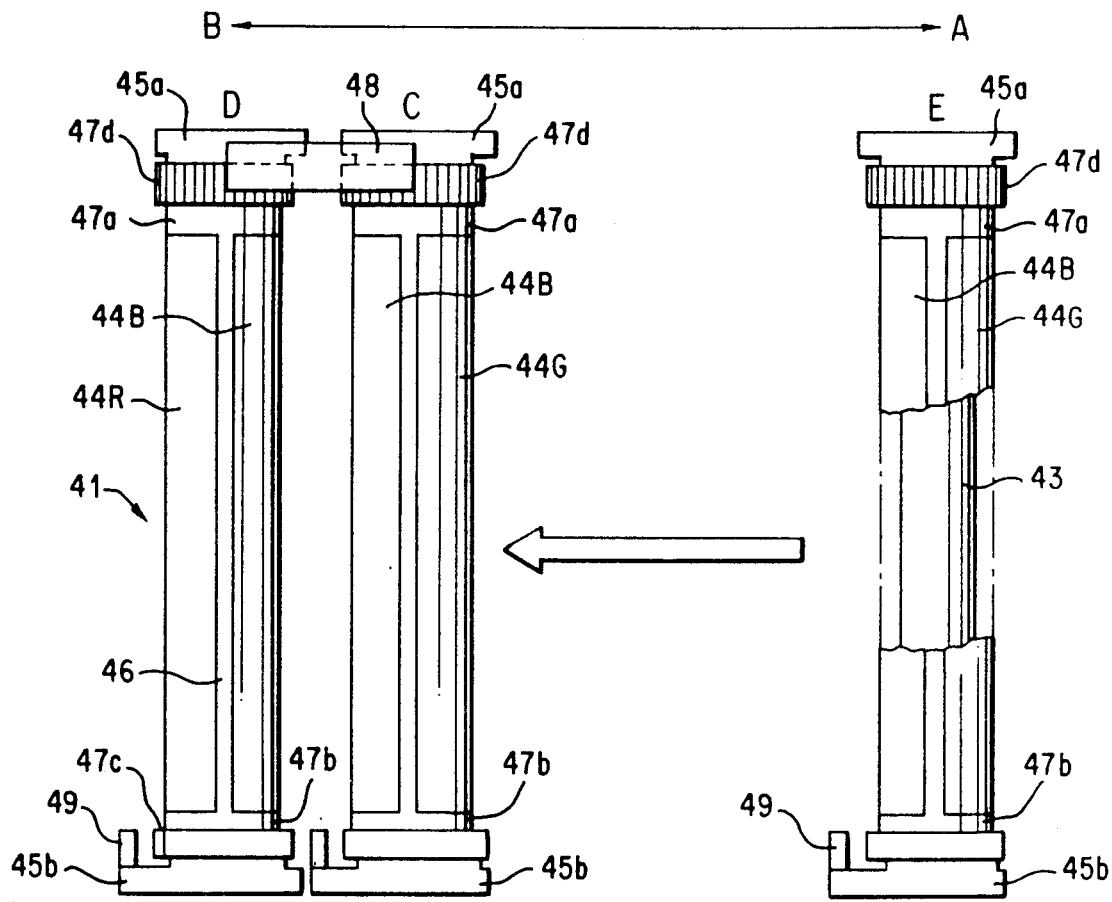
FIG. 4 (a) and 4 (b) are plan and cross-sectional views of the exposure device, the views showing the manner in which the exposure device moves over its stroke and switches color separation filters.

FIGS. 4 (a) and 4 (b) illustrate the exposure device 41 in greater detail.

The exposure device 41 comprises a linear light source 42 which emits white color light, a reflecting member 43 for reflecting light from the light source 42 in one direction, a cylindrical frame 46 having three independent openings defined therein, at substantially equal circumferential intervals and supporting color separation filters 44R, 44G, 44B of red, green, blue therein, a pair of axially spaced cylindrical supports 47a, 47b supporting the frame 46 and rotatable therewith, the cylindrical support 47a supporting a gear 47d on its outer end, and a pair of axially spaced rectangular frames 45a, 45b on which the respective supports 47a, 47b are rotatably supported. The frames 45a, 45b are joined to each other by a tie plate (not shown), thus making the exposure device 41 unitary in structure.

One of the color separation filters 44R, 44G, 44B is positioned in the opening of the reflecting member 43, i.e., directly below the light source 42. In illustrated embodiment of FIGS. 4a and 4b, the filter 44R is positioned below the light source 42. The exposure device 41 is movable reciprocally in the directions indicated by arrows A, B by means of a suitable scanning actuator or motor 105 (FIG. 2) for applying light to a desired area on a photosensitive recording medium. Preferably, the scanning motor 105 is part of a lamp moving unit 111 (FIG. 2) and has variable speeds to vary the scanning speed of the exposure device 41. As detailed below, the scanning speed can be set to a predetermined scanning speed corresponding to the set exposure level.

The support 47a houses a one-way clutch (not shown) which allows the cylindrical frame 46 to rotate in the direction indicated by an arrow H only when the exposure device 41 moves back in the direction indicated by the arrow B from a position C to a home position D while the gear 47d on the support 47a is brought into meshing engagement with a fixed rack 48. When the cylindrical frame 46 is thus rotated, another color separation filter, here the filter 44G, is angularly moved into the position below the light source 42.

Figure 4B:
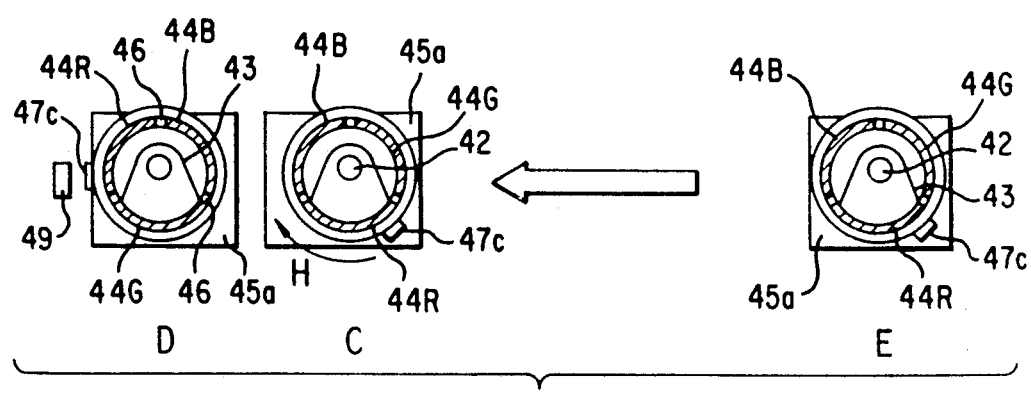

In operation, the exposure device 41 is moved in the direction indicated by the arrow A toward a position E at the righthand end of its stroke while light from the light source 42 is radiated out through the red filter 44R for scanning exposure at a predetermined scanning speed. Thereafter, the light source 42 is deenergized, and the exposure device 41 is moved back in the direction indicated by the arrow B. On the backward stroke, the gear 47d on the support 47a meshes with the rack 48 in the position C, thus rotating the frame 46 in the direction indicated by the arrow H (FIG. 4b). When the exposure device 41 reaches the home position D, the next filter, particularly the green filter 44G, is positioned in the opening of the reflecting member 43 in preparation for a next cycle of scanning exposure.

The support 47b has a reference filter position mark 47c for detecting the reference position of the filters 44R, 44G, 44B. A reference filter position sensor 49 is positioned such that it faces the reference position mark 47c when the exposure device 41 is in the home position D. The filter which is located directly below the light source 42 or in the opening of the reflecting member 43 can be determined by the controller 200 (described below) in conjunction with the sensor 49. In particular, the position of the position mark 47c provided on the support 47b is prescribed as the nearest position to the red filter 44R. As shown in FIG. 4(b), the blue filter 44B is provided at the left side of the red filter 44R and the green filter 44G is provided at the right side of the red filter 44R. And, when the reference filter position sensor 49 detects the reference position mark 47, the green filter 44G is located directly below the light source 42. When the reference filter position sensor 49 does not detect the reference position mark 47 and the position of the filter has been changed one time by the rack 48, the blue filter 44B is located directly below the light source 42. When the reference filter position sensor 49 does not detect the reference position mark 47 and the position of the filter has been changed two times by the rack 48, the red filter 44R is located directly below the light source 42. The control 200 (described below) includes suitable counters for detecting the number of times that the filter position is changed.

As described above, the color separation filters 44R, 44G, 44B are disposed around the linear light source 42 and the reflecting member 43, and are successively brought into the position below the light source 42 in response to the movement of the exposure device 41 itself over its stroke. Accordingly, the exposure device 41 is a space saver and is of a simple and inexpensive structure.

A photosensitive recording medium or sheet 50 is primarily made of a photosetting resin including a photopolymerization initiator. More specifically, the photosensitive recording medium 50 comprises a base sheet coated with photo-curable resins which will be photocured upon exposure to light having wavelengths of red, green and blue, and microcapsules containing dye precursors of cyan, magenta and yellow. The photosensitive recording medium 50 is housed in a supply roll in a cartridge 51 in a light shielded condition. The photosensitive recording medium 50 which is drawn out of the cartridge 51 passes between the belt 31a and an exposure table 52, goes past a fastening roller 56, a tension roller 55, a movable guide 64, a pressure developing unit 70, and a drive roller 57, and is wound around a takeup roller 54. When the photosensitive recording medium 50 is to be exposed to light from the exposure device 41, the exposure table 52 is elevated by a cam 53 to bring the photosensitive recording medium 50 into close contact with a mask member 15 which has been fed by the feed belt 31a. While an image is being developed by the pressure developing unit 70, the photosensitive recording medium 50 is gripped and fastened in position by the fastening roller 56, and is also prevented from sagging by the tension roller 55. The drive roller 57 serves to feed the photosensitive recording medium 50 at a constant speed.

A color developer sheet 60 comprises a base sheet coated with a color developer disclosed in U.S. Pat. No. 4,399,209 and Japanese Patent Application Kokai No. 58-88739, for example. A stack of such color developer sheets 60 is stored in a cassette 61 with their coated surfaces facing downwardly. The color developer sheets 60 are fed, one by one, from the cassette 61 by a feed roller 62 which is intermittently operated by an actuator (not shown), and supplied to the pressure developing unit 70. The supplied color developer sheet 60 is placed over the exposed area of the photosensitive recording medium 50, and pressed thereagainst by a pair of pressure rollers 71 in the pressure developing unit 70, whereupon a latent image which has been formed on the photosensitive recording medium 50 by exposure to light from the exposure device 41 is visualized on the color developer sheet 60.

A thermal fixing unit 80 comprises a heat roller 82 with a heater 81 disposed therein, an auxiliary roller 85, an endless belt 84 trailed around the heat roller 82 and the auxiliary roller 85, and a pinch roller 83 pressed against the heat roller 82 with the endless belt 84 therebetween. The color developer sheet 60 which has been fed from the pressure developing unit 70 and guided by the movable guide 64 is introduced into the thermal fixing unit 80 in which the color developer sheet 60 is calendared to fix the visualized image. The color developer sheet 60 is then discharged from the thermal fixing unit 80 onto a discharge tray 63.

Figure 3:
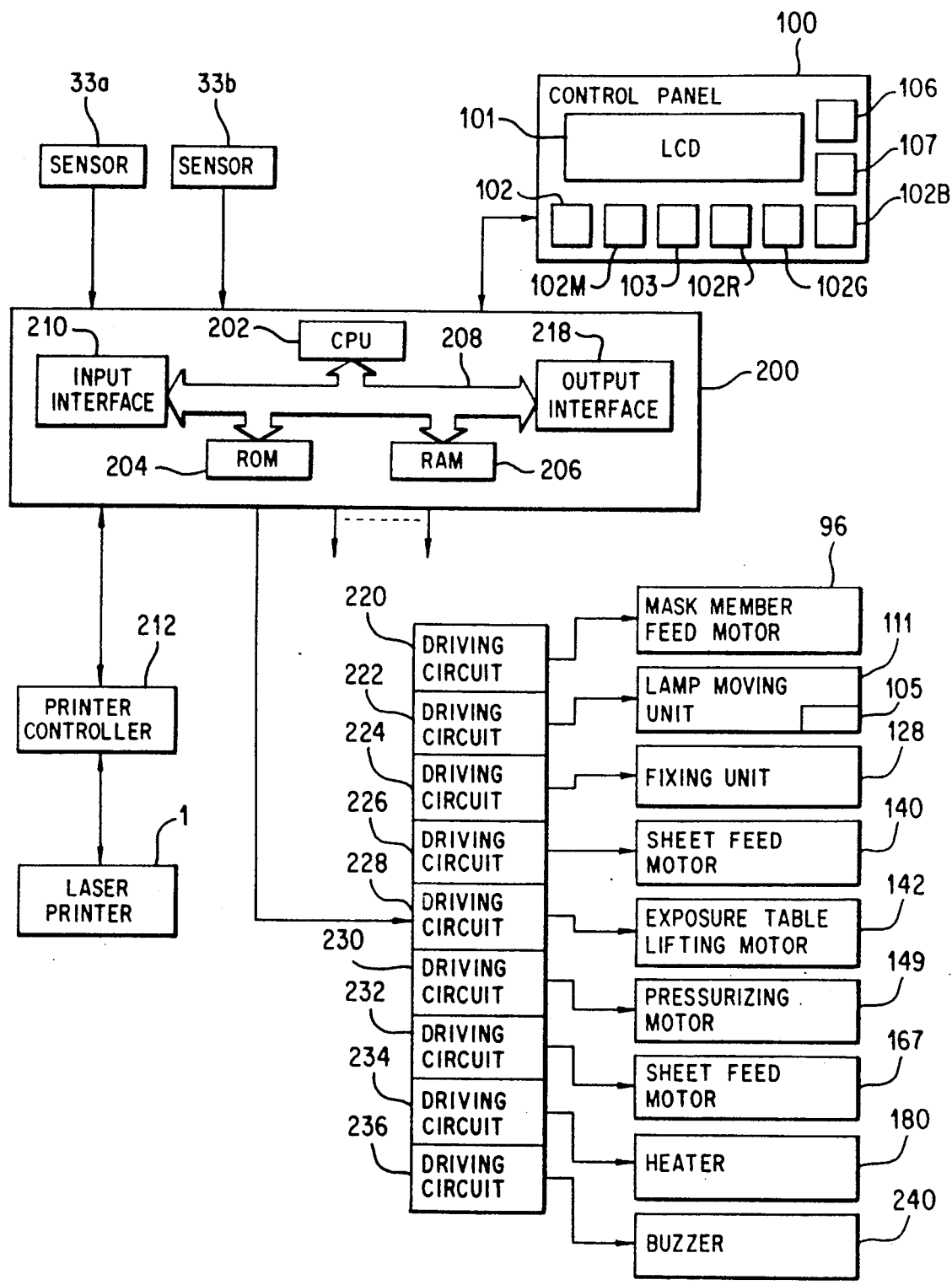
FIG. 3 is a block diagram of a controller employed in the color image recording apparatus.

The operation of the image recording apparatus is controlled by a controller 200 (FIG. 3). A microcomputer comprising a CPU 202, a ROM 204, a RAM 206 and a bus 208 interconnecting these devices is the principal component of the controller 200. An input interface 210 is connected to the bus 208. A monochromatic printer controller 212 for controlling a monochromatic printer 10, an input panel 100, a pressurizing position detector 174 and a sheet delivery detector 192 are connected to the input interface 210.

Connected to an output interface 218 connected to the bus 203 are driving circuits 220, 222, 224, 226, 228, 230, 232, 234 and 236, which in turn are connected respectively to a mask member feed motor 96, a lamp moving unit 111 for operating the scanning motor 105 to move the lamp 42 at a predetermined scanning speed, a fixing unit 128, a photosensitive pressure sensitive sheet feed motor 140, an exposure table lifting unit 142, a pressurizing motor 149, developing sheet feed motor 167, a heater 180 and a buzzer 240 or alarm. When a developing sheet 60 is jammed, the buzzer 240 sounds to inform the operator. The jam information and other necessary information are displayed on a LCD.

The RAM 206 having a work area stores control flags for operating the control process as described below.

The ROM 204 stores a data conversion table for converting light exposure data into scanning speed data (FIG. 6), and programs for controlling process means necessary for image recording, including a hardware interrupt program, a process control program for controlling the foregoing mechanisms for printing images and an emergency management program. The conversion table correlates, for each color mode, a particular light exposure level with a particular scanning speed. For example, exposure level 4 for the red mode has a corresponding scanning speed VR4. The value of scanning speeds corresponding to the selected exposure level can be determined experimentally and input into the conversion table of FIG. 6. The variable speed scanning motor 105 is then driven at the scanning speed corresponding to the selected exposure level.

Figure 2:
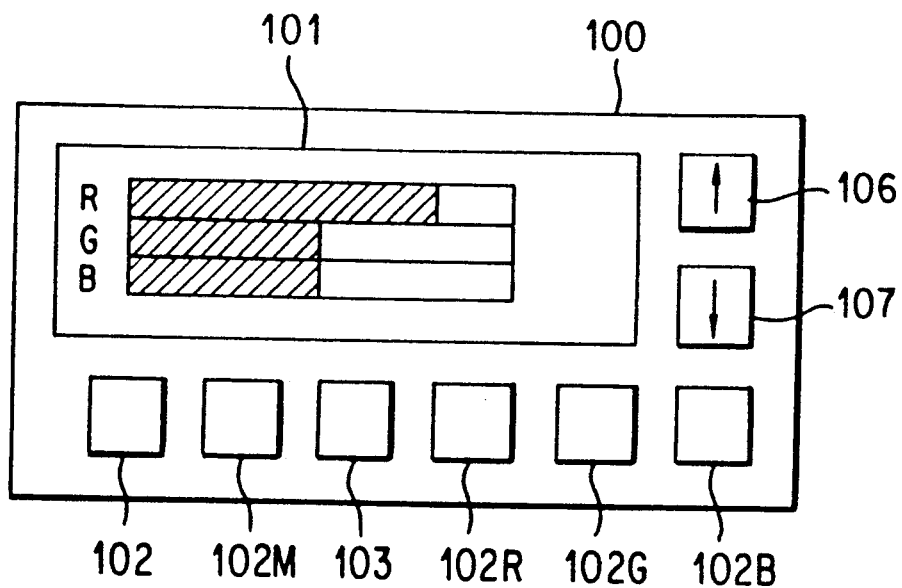
FIG. 2 is a detailed plan view of a portion of a display unit employed in the color image recording apparatus.

Referring to FIG. 2, the input panel 100 (FIG. 3) is provided with a display 101 for displaying set modes including light exposures, and a selector key 102 for setting modes. The input panel 100 may also include a stop key 103. The display 101 has a liquid crystal panel which displays the respective densities (light quantities) of red, green and blue images in a bar graph. Longer bars in the bar graph indicate higher densities (greater light quantities). A mode selector key 102M is depressed to display the set mode of the image recording apparatus 20 and light exposures successively. Indicated at 102R, 102G and 102B are red, green and blue light exposure setting keys, at 106 is a light exposure increasing key, and at 107 is a light exposure reducing key. These selector keys are the components of the light exposure setting means.

Figure 5:
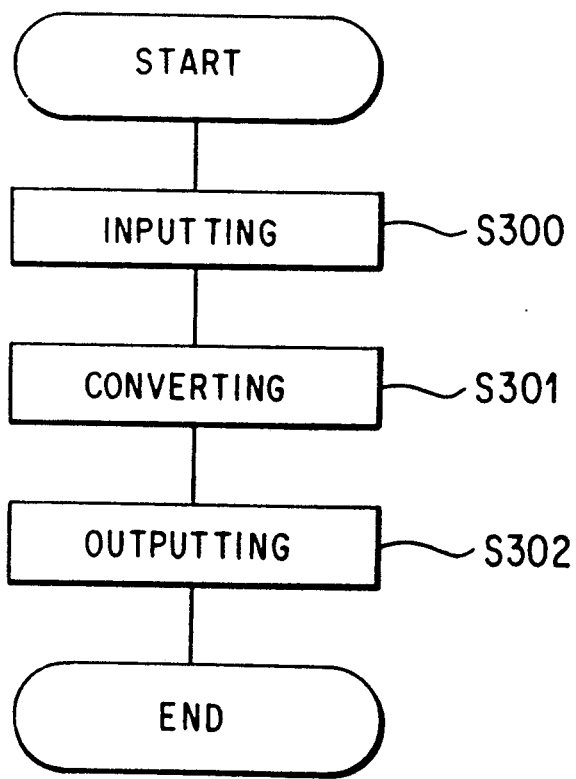
FIG. 5 is a flow chart of a program to be executed by the controller of the color image recording apparatus.

Operation of the controller 200 for converting light exposure data into scanning speed data will be described hereinafter with reference to a flow chart shown in FIG. 5.

In step S300, the CPU 202 receives the light exposure data inputted by key 102R, 102G, 102B, 106 and 107, and the display 101 displays the light exposure data in the form of the bar graphs on display 101. In step S301, the CPU 202 converts the light exposure data into equivalent scanning speed data with reference to the conversion table of FIG. 6 stored in the ROM 204, and then the CPU 202 applies the corresponding scanning speed data to the lamp moving unit 111 in step S302 to set the scanning speed of the scanning motor 105 to the predetermined speed corresponding to the selected exposure level.

The color image recording apparatus 20 thus constructed operates as follows:

In setting red, green and blue light exposures, the mode selector key 102M of the input panel 100 is depressed to display a mode for which the image recording apparatus 20 is set on the display 101. As the mode selector key 102M is depressed continuously, red, green and blue light exposures are displayed on the display 101. In increasing the red light exposure, the light exposure increasing key 106 is depressed after depressing the red light exposure setting key 102R until the bar indicating a red light exposure on the display 101 extends to a desired length representing a desired red light exposure. In reducing the red light exposure, the exposure reducing key 107 is depressed after depressing the red light exposure setting key 102R until the bar indicating a red light exposure on the display 101 contracts to length representing a desired red light exposure. A desired green light exposure and a desired blue light exposure are set similarly by operating the green light exposure setting key 102G, the blue light exposure setting key 102B, the light exposure increasing key 106 and/or the light exposure reducing key 107. The set red, green and blue light exposures set by operating the input panel 100 are converted into equivalent scanning speed data by the ROM 204 in the controller 200. The lamp 42 for scanning is driven by the scanning motor at the predetermined speed according to the scanning speed data outputted from ROM 204 to a lamp moving unit 111 under the control of the controller 200. A higher scanning speed corresponds to a lesser light exposure.

It is assumed that a red mask member 15R is produced by the monochromatic laser printer 1. The mask member 15R has a toner pattern thereon as a light-shielding image, and light passing through the mask member 15R, except its light-shielding image portion, photocures those microcapsules which contain a dye precursor of cyan on the photosensitive recording medium 50.

At this time, the discharge tray 12 of the monochromatic laser printer 1 is in the solid-line position. The produced mask member 15R is guided by the guide member 22 into the mask member feeder 21 in the color image recording apparatus 20.

If it is confirmed by a sensor in the positioning unit 31 that there is no other mask member present in the positioning unit 31, then the mask member 15R is guided by the gate 23 so that it is fed into the positioning unit 31.

The positioning unit 31 electrostatically attracts the mask member 15R to the feed belt 31a, and feeds the mask member 15R into an exposure position therein. Thereafter, the positioning unit 31 is moved by actuators (not shown) in the directions indicated by the arrows X, Y in FIG. 1 until the mask member 15R is properly positioned in the exposure position while the positioning marks on the mask member 15R are being sensed by the positioning mark sensors on the sensor bar 33.

At the same time that the mask member 15R is thus positioned, the mask member identifying marks (not shown) on the mask member 15R are sensed by the corresponding sensors 33a, 33b on the sensor bar 33, so that the color of the mask member 15R is detected by a control unit. If the filter positioned below the light source 42 of the exposure device 41 does not correspond to the mask member 15R, then, the exposure device 41 is reciprocally moved to angularly rotate the frame 46 until the proper filter 44R is positioned below the light source 42. Then, the photosensitive recording medium 50 is fastened by the fastening roller 56, and the cam 53 is rotated by an actuator (not shown) to elevate the exposure table 52. The photosensitive recording medium 50 is now held intimately against the feed belt 31a of the positioning unit 31 with the mask member 15R sandwiched therebetween.

When the exposure table 52 is in close contact with the positioning unit 31, the lamp 42 is turned ON, and red light is applied from the red filter 44R through the mask member 15R to the photosensitive recording medium 50 while at the same time it is being scanned by the exposure device 41 in the direction indicated by the arrow A, until the exposure device 41 reaches the position E in FIGS. 4 (a) and 4 (b). The red light exposure entered by operating the input panel 100 is converted by the ROM 204 into equivalent scanning speed data representing a predetermined scanning speed of the lamp 42 for red light exposure operation, and then the controller 200 directs the lamp moving unit 111 to drive the scanning motor to make the lamp 42 run at the corresponding scanning speed. After the exposure, the lamp 42 is deenergized, and the exposure device 41 moves back toward the position C in FIGS. 4 (a) and 4 (b) in the direction indicated by the arrow B. When the exposure device 41 moves from the position C to the home position D, the gear 47d on the support 47a is kept in mesh with the rack 48, rotating the frame 46 and the supports 47a, 47b in the direction indicated by the arrow H in FIG. 4 (b), until the next filter, e.g., the green filter 44G, is positioned below the lamp 42. While the exposure device 41 is moving back, the exposure table 52 is lowered by the cam 53 so that the photosensitive recording medium 50 is spaced downwardly from the positioning unit 31 and the mask member 15R.

At this time, the photosensitive recording medium 50 is held under back tension by the supply roll in the cartridge 51. When the exposure table 52 is lifted, the length of the photosensitive recording medium 50 which corresponds to the upward displacement of the exposure table 52 is drawn out of the cartridge 51. When the exposure table 52 is lowered after exposure, the length of the photosensitive recording medium 50 which corresponds to the downward displacement of the exposure table 52 is withdrawn into the cartridge 51, thereby taking up any sag in the photosensitive recording medium 50.

After the exposure using the red mask member 15R is completed and the descent of the exposure table 52 is confirmed, the feed belt 31a of the positioning unit 31 is moved to deliver the mask member 15R into the circulation guide 25, from which the red mask member 15R is guided by the gate 28 into the upper storage tray 26.

Then, the green mask member 15G generated by the monochromatic laser printer 1 passes through the guide 22, and is guided by the gate 23 into the positioning unit 31 in which the green mask member 15G is positioned with respect to the photosensitive recording medium 50.

If the filter in the operative position of the exposure device 41 as recognized by the controller 200 using the position filter detector 49 does not correspond to the green mask member 15G at this time as detected by the identifying mark sensor 33b, then the exposure device 41 is operated until the proper filter 44G is positioned below the lamp 42.

Then, the exposure table 52 is elevated to hold the photosensitive recording medium 50 and the green mask member 15G closely against the feed belt 31a, and the lamp 42 is energized to expose the photosensitive recording medium to green light from the green filter 44G. Following the exposure, the exposure table 52 descends, and the green mask member 15G is guided through the circulation guide 25 and introduced by the gate 28 into the lower storage tray 27. The exposure device 41 moves back, and the frame 46 is rotated to position the blue filter 44B below the lamp 42. As stated above, the green light exposure data entered by operating the input panel 100 is converted into equivalent scanning speed data representing the scanning speed of the lamp 42 for green light exposure operation. The scanning motor 105 drives the lamp 42 according to the scanning speed data.

The blue mask member 15B generated by the monochromatic laser printer 1 is then delivered by the mask member feeder 21 and positioned by the positioning unit 31. Thereafter, the photosensitive recording medium 50 is exposed to blue light by the exposure device 41. Through the above process, a desired colored latent image is formed on the photosensitive recording medium 50.

Then, the exposure table 52 is lowered and the fastening roller 56 is released from the photosensitive recording medium 50, which is then fed by the drive roller 57 in the direction indicated by the arrow C. At this time, the tension roller 55 and the movable guide 64 are in the solid line position. The pressure rollers 71 of the pressure developing unit 70 are spaced from each other. Therefore, while the photosensitive recording medium 50 is being fed and wound up by the takeup roller 54, the microcapsules on the photosensitive recording medium 50 are not damaged or ruptured by contact with these components. The drive roller 57 is stopped when the trailing end of the latent image on the photosensitive recording medium 50 arrives at the pressure roller 71 of the pressure developing unit 70.

In synchronism with the movement of the photosensitive recording medium 50, a color developer sheet 60 is delivered from the cassette 61 by the sheet feed roller 62. The color developer sheet 60 from the cassette 61 is stopped when its leading edge faces the trailing end of the latent image on the photosensitive recording medium 50.

The pressure rollers 71 of the pressure developing unit 70 are then rotated and held against each other by an actuator (not shown), and the photosensitive recording medium 50 is gripped and fastened by the fastening roller 56. The photosensitive recording medium 50 and the color developer sheet 60 which are held in superposed relation to each other are pressed and fed in the direction indicated by the arrow D. At this time, those microcapsules which are not photo-cured on the photosensitive recording medium 50 are ruptured under pressure, and a colored visible image corresponding to the latent image on the photosensitive recording medium 50 is developed on the color developer sheet 60.

As the pressure rollers 71 rotate in the directions indicated by the arrows, the tension roller 55 is moved in the direction indicated by the arrow E, taking up any sag in the photosensitive recording medium 50. While the tension roller 55 moves in the direction indicated by the arrow E, the movable guide 64 is moved by a mechanism (not shown) into the solid-line position to separate the leading edge of the color developer sheet 60 from the photosensitive recording medium 50, and guide the color developer sheet 60 toward the thermal fixing unit 80.

In the thermal fixing unit 80, heat energy is applied to the color developer sheet 60 by the heater 81 through the rotating heat roller 82 and the endless belt 84 to promote color development of the colored image. At the same time, a binder polymer is thermally fused on the color developer sheet 60 for securing the color developers to the base sheet. The color developer sheet 60 is now calendared to the same smoothness as that of the surface of the endless belt 84, so that the color developer sheet 60 has a suitable glossy surface.

After the color developing and calendaring process, the color developer sheet 60 is separated from the endless belt 84 through a curved path, and discharged onto the discharge tray 63.

Although the light exposure setting means of the foregoing embodiment employs the key switches, the key switches may be substituted by lever switches. The red, green and blue light exposure setting key switches may be substituted by a single mode selector key for selecting a red light exposure setting mode, a green light exposure setting mode or a blue light exposure setting mode.

While the invention has been described in detail and with reference to specific embodiment thereof, it would be apparent for those skilled in the art that various changes and modifications can be made therein without departing from the spirit and scope of the invention.

What is claimed is:

1. A color image recording apparatus for recording an image on a photosensitive recording medium by means of light transmitted through a succession of mask members prepared based on colored image information, the color image recording apparatus comprising:
   exposure means for exposing the photosensitive recording medium, the exposure means including scanning means driven at a predetermined scanning speed to expose the photosensitive recording medium to light through each of the mask members;
   exposure amount setting means for selectively setting light exposure amounts to be applied to the photosensitive recording medium by the scanning means;
   exposure amount indicating means for selectively indicating the light exposure amounts to be applied to the photosensitive recording medium by the scanning means;
   data converting means for converting the set light exposure amount into equivalent scanning speed data and controlling the exposure means to drive the scanning means at the predetermined speed corresponding to the set light exposure amount.

2. The color image recording apparatus as claimed in claim 1, further comprising mask member transfer means for transferring the mask member to an exposure zone of the exposure means, the mask member transfer means including:
   a plurality of storage means each for storing one of the mask members, the storage means being positioned upstream of the exposure means; and
   feed means for individually feeding the mask members from the storage means, the feed means having a feed control means for selectively feeding one of the mask members stored in the storage means.

3. The color image recording apparatus as claimed in claim 1, wherein the exposure means comprises a single light source, and three filters rotatably disposed around the light source, the three filters being arranged circumferentially and equidistantly, one specific color separated light being generated at one specific angular position of the exposure means, and the image recording apparatus further comprising means for changing an angular rotational position of the filters relative to the specific angular position to change the color separated light.

4. The color image recording apparatus as claimed in claim 1, wherein the data converting means includes a memory having a conversion table stored therein to be used for converting light exposure amounts into equivalent scanning speed data, each light exposure amount having a corresponding scanning speed.

5. The color image recording apparatus as claimed in claim 4, wherein an increase in light exposure amounts corresponds to a decrease in scanning speeds in said conversion table.

6. The color image recording apparatus as claimed in claim 1, wherein the exposure amount indicating means includes a display for displaying a graph representing the respective densities of individual monochromatic color images.

7. The color image recording apparatus as claimed in claim 1, wherein the exposure amount setting means includes selecting means for selecting one of a plurality of colors, and light exposure amount adjusting means for varying the light exposure amount for an image of the selected color.

8. The color image recording apparatus as claimed in claim 7, wherein the exposure amount adjusting means is used in common for adjusting the exposure amounts respectively for all the individual monochromatic images.

9. The color image recording apparatus claimed in claim 1, wherein the data converting means includes a memory having a conversion table stored therein to be used for converting light exposure amounts respectively for each monochromatic color image into equivalent scanning speed data, each light exposure amount having a corresponding scanning speed for each monochromatic color image.

10. A color image recording apparatus for recording an image on a photosensitive recording medium by means of light transmitted through a succession of mask members prepared based on colored image information, the color image recording apparatus comprising:

exposure means for exposing the photosensitive recording medium, the exposure means including scanning means driven at a predetermined scanning speed to expose the photosensitive recording medium to light through each of the mask members;

exposure amount setting means for selectively setting light exposure amounts to be applied to the photosensitive recording medium by the scanning means, the exposure amount setting means comprising color selecting means for selecting one of a plurality of colors, and light exposure adjusting means for varying the light exposure amount for a color selected by the color selecting means;

exposure amount indicating means for selectively indicating the set exposure amount to be applied to the photosensitive recording medium by the scanning means, the exposure amount indicating means including a display for displaying a graph representing the respective densities of individual monochromatic color images; and data converting means for converting the set light exposure amount into equivalent scanning speed data and for controlling the exposure means to drive the scanning means at the predetermined speed corresponding to the set light exposure amount, an increase in light exposure amounts corresponding to a decrease in scanning speeds.

11. The color image recording apparatus as claimed in claim 10, further comprising mask member transfer means for transferring the mask member to an exposure zone of the exposure means, the mask member transfer means including:

a plurality of storage means each for storing one of the mask members, the storage means being positioned upstream of the exposure means; and feed means for individually feeding the mask members from the storage means, the feed means having a feed control means for selectively feeding one of the mask members stored in the storage means.

12. The color image recording apparatus as claimed in claim 10, wherein the exposure means comprises o a single light source, and three filters rotatably disposed around the light source, the three filters being arranged circumferentially and equidistantly, one specific color separated light being generated at one specific angular position of the exposure means, and the image recording apparatus further comprising means for changing an angular rotational position of the filters relative to the specific angular position to change the color separated light.

13. The color image recording apparatus as claimed in claim 10, wherein the exposure adjusting means is used in common for adjusting light exposure amounts respectively for all the individual monochromatic color images.

14. A color image recording apparatus for recording an image on a photosensitive recording medium by means of light transmitted through a succession of mask members prepared based on colored image information, the color image recording apparatus comprising:

exposure means for exposing the photosensitive recording medium, the exposure means including scanning means driven at a predetermined scanning speed to expose the photosensitive recording medium to light through each of the mask members;

exposure amount setting means for selectively setting light exposure amounts to be applied to the photosensitive recording medium by the scanning means;

exposure amount indicating means for selectively indicating the set light exposure amount to be applied to the photosensitive recording medium by the scanning means; and control means for determining the predetermined speed of the scanning means in relation to the light exposure amount set by the exposure amount setting means, the control means including data converting means for converting a set light exposure amount to a corresponding predetermined scanning speed.

15. The color image recording apparatus as claimed in claim 14, wherein the data converting means includes a memory having a conversion table stored therein to be used for converting light exposure amounts into equivalent scanning speed data, each light exposure amount having a corresponding scanning speed.

16. The color image recording apparatus as claimed in claim 15, wherein an increase in light exposure amounts corresponds to a decrease in scanning speeds in said conversion table.

17. The color image recording apparatus as claimed in claim 14, wherein the exposure amount indicating means includes a display for displaying a graph representing the respective densities of individual monochromatic color images.

18. The color image recording apparatus as claimed in claim 14, wherein the exposure amount setting means includes selecting means for selecting one of a plurality of colors, and light exposure amount adjusting means for varying the light exposure amount for an image of the selected color.

19. The color image recording apparatus as claimed in claim 18, wherein the light exposure amount adjusting means is used in common for adjusting the exposure amounts respectively for all the individual monochromatic images.

20. The color image recording apparatus claimed in claim 14, wherein the data converting means includes a memory having a conversion table stored therein to be used for converting light exposure amounts respectively for each monochromatic color image into equivalent scanning speed data, each light exposure amount having a corresponding scanning speed for each monochromatic color image.

* * * * *